United States Patent
Steinau et al.

(10) Patent No.: US 11,696,389 B2
(45) Date of Patent: Jul. 4, 2023

(54) ELECTRONIC CONTROL APPARATUS AND METHOD FOR PRODUCING AN ELECTRONIC CONTROL APPARATUS

(71) Applicant: Vitesco Technologies Germany GMBH, Hannover (DE)

(72) Inventors: Martin Steinau, Nuremberg (DE); Karl Maron, Heroldsberg (DE)

(73) Assignee: Vitesco Technologies Germany GMBH, Hannover (DE)

( * ) Notice: Subject to any disclaimer, the term of this patent is extended or adjusted under 35 U.S.C. 154(b) by 63 days.

(21) Appl. No.: 17/226,857

(22) Filed: Apr. 9, 2021

(65) Prior Publication Data

US 2021/0227681 A1    Jul. 22, 2021

Related U.S. Application Data

(63) Continuation of application No. PCT/EP2019/074577, filed on Sep. 13, 2019.

(30) Foreign Application Priority Data

Oct. 11, 2018 (DE) ..................... 10 2018 217 456.3

(51) Int. Cl.
*H05K 1/02* (2006.01)
*H05K 3/00* (2006.01)
*H05K 3/28* (2006.01)

(52) U.S. Cl.
CPC ......... *H05K 1/0209* (2013.01); *H05K 3/0061* (2013.01); *H05K 3/284* (2013.01); *H05K 2201/066* (2013.01)

(58) Field of Classification Search
CPC ..................... H05K 2201/066; H05K 1/0209
See application file for complete search history.

(56) References Cited

U.S. PATENT DOCUMENTS 5,057,903 A   10/1991  Olla
5,366,688 A * 11/1994  Terpstra .............. H01L 21/4871
                                                      419/36

(Continued)

FOREIGN PATENT DOCUMENTS

DE    102006018457 A1    11/2006
DE    102009033949 A1     1/2011

(Continued)

OTHER PUBLICATIONS

International Search Report and Written Opinion dated Dec. 16, 2019 from corresponding International Patent Application No. PCT/EP2019/074577.

(Continued)

*Primary Examiner* — Mukundbhai G Patel

(57) ABSTRACT

The disclosure provides an electronic control apparatus including a printed circuit board with a first surface side and a second surface side and with at least one electronic component that is arranged on at least one of the surface sides of the printed circuit board. At least one heat sink is arranged on the printed circuit board on the opposite surface (Continued)

side from the electronic component for the purpose of heat dissipation. The printed circuit board with the electronic component and the heat sink are surrounded by a casing made from a thermosetting plastic material such that at least one outer side of the heat sink is free of thermosetting plastic material.

12 Claims, 1 Drawing Sheet

(56) References Cited

U.S. PATENT DOCUMENTS

| | | | |
|---|---|---|---|
| 6,445,592 | B1 | 9/2002 | Schirmer et al. |
| 8,358,514 | B2 | 1/2013 | Tanaka |
| 2004/0089931 | A1 | 5/2004 | Nakajima et al. |
| 2006/0012034 | A1* | 1/2006 | Kadoya ................ H05K 1/0203 257/713 |
| 2006/0077643 | A1 | 4/2006 | Mayuzumi et al. |
| 2006/0250756 | A1 | 11/2006 | Sugimoto et al. |
| 2006/0250776 | A1 | 11/2006 | Abu-Haj et al. |
| 2008/0170372 | A1 | 7/2008 | Kirigatani et al. |
| 2014/0252265 | A1 | 3/2014 | Gabriel |
| 2015/0009629 | A1 | 1/2015 | Hyung et al. |
| 2015/0359107 | A1 | 6/2015 | Steinau |
| 2018/0102304 | A1 | 4/2018 | Herman et al. |
| 2019/0230804 | A1* | 7/2019 | Zweigle ................ H05K 5/0082 |

FOREIGN PATENT DOCUMENTS

| | | |
|---|---|---|
| DE | 102013226764 A1 | 1/2015 |
| DE | 102014201032 A1 | 7/2015 |
| DE | 102015207310 A1 | 10/2016 |
| EP | 0641154 A1 | 3/1995 |
| EP | 1646271 A2 | 4/2006 |
| JP | 2004165406 A | 6/2004 |
| JP | 2008172172 A | 7/2008 |
| JP | 2014112658 A | 6/2014 |
| WO | 20131378379 | 4/2006 |
| WO | 2013178380 A1 | 12/2013 |
| WO | 2017057093 A1 | 4/2017 |

OTHER PUBLICATIONS

German Office Action dated Dec. 8, 2019 for corresponding German Patent Application No. 10 2018 217 456.3.

Japanese Office Action dated Aug. 27, 2022 for corresponding Patent Application No. 2021-519785.

* cited by examiner

ELECTRONIC CONTROL APPARATUS AND METHOD FOR PRODUCING AN ELECTRONIC CONTROL APPARATUS

CROSS-REFERENCE TO RELATED APPLICATIONS

This application claims the benefit of PCT Application PCT/EP2019/074577, filed Sep. 9, 2019, which claims priority to German Application DE 10 2018 217 456.3, filed Oct. 11, 2018. The disclosures of the above applications are incorporated herein by reference.

TECHNICAL FIELD

The disclosure relates to an electronic control apparatus and a method for producing an electronic control apparatus.

BACKGROUND

Electronic control apparatuses with a sheet aluminum housing or a diecast aluminum housing and methods for producing electronic control apparatuses with such a housing are known.

SUMMARY

The disclosure provides an improved electronic control apparatus compared to the prior art and an improved method for producing an electronic control apparatus compared to the prior art.

According to the disclosure, the electronic control apparatus includes a printed circuit board with a first surface side and a second surface side and with at least one electronic component, for example a resistor, a capacitor or an inductive component. The electronic component is arranged on at least one of the surface sides of the printed circuit board. At least one heat sink is arranged on the printed circuit board on the opposite surface side from the electronic component for the purpose of heat dissipation. The printed circuit board with the electronic component and the heat sink are surrounded by a casing made from a thermosetting plastic material such that at least one outer side of the heat sink is free of thermosetting plastic material. By way of example, the heat sink is covered or encased by the thermosetting plastic material on at least one side, for example, on the inside (in the direction of the printed circuit board). Alternatively, the heat sink may also be encased by the thermosetting plastic material on both sides.

In some implementations, the thermosetting plastic material has material properties that are such that there is no gap formation between the casing and the heat sink. For example, the thermosetting plastic material is sufficiently flowable and stretchable when being processed and introduced as gap material and has an appropriate coefficient of thermal expansion. The thermosetting plastic material is then sufficiently solid in the cured state.

The electronic control apparatus has the advantage that the use of a thermally conductive thermoplastic as heat sink allows joining methods to be used that avoid an adhesive or a laminating film.

Another advantage of the specified electronic control apparatus is that an additional process step for installing a heat sink is avoided, since a process step for squeezing an adhesive and lamination of a baseplate and a printed circuit board are avoided by virtue of these processes already being performed during connector installation.

Moreover, the specified electronic control apparatus has the advantage that the geometry of the heat sink can be matched to the locations on the printed circuit board that are to be cooled. By way of example, it is possible for the heat sink to have a complex geometry, for example extensions, such as protruding ribs.

The specified method for producing the electronic control apparatus has the advantage that the method is cheaper than, for example, a diecast aluminum housing or sheet metal housing.

In some implementations, the heat sink is formed from a thermoplastic. By way of example, the thermoplastic has a high thermal conductivity.

In some examples, the thermoplastic used as a heat sink is provided with thermally conductive particles. For example, a heat produced by a component of the printed circuit board, for example, is better dissipated from the printed circuit board as a result.

In some implementations, the thermally conductive particles are graphite particles and/or metal particles, such as aluminum particles. The thermally conductive particles have a thermal conductivity that is comparable to the thermal conductivity of metallic components, for example. In addition, the metal particles, such as the aluminum particles, also have an electrical conductivity. The graphite particles have electrically insulating properties and, together with the thermoplastic material, form an electrically insulating layer.

In some examples of the electronic control apparatus, the heat sink is in planar form toward the surface side of the printed circuit board. Furthermore, the heat sink may be provided with a profile towards the opposite side of the printed circuit board. For example, the profile may be an area extension, such as a ribbed profile. By way of example, the heat sink is arranged extensively or over a large area on the surface side of the printed circuit board, and a ribbed profile is arranged on the surface of the heat sink that faces away from the printed circuit board.

Moreover, the disclosure provides an electronic control apparatus, where the heat sink is materially bonded to the surface side of the printed circuit board, for example after a casing is put on.

In some examples, the heat sink rests on at least one mechanical interface, for example a housing, to a device, for example a motor or hydraulic element, via contact points.

In some implementations, the casing has at least one hole. By way of example, a fastening element, for example a screw, can be put through the hole. This fastens the printed circuit board for example to a mechanical interface, such as a housing of a motor. Alternatively, the printed circuit board may be fastened to a device housing by an additional fastening element, such as a clip.

The method for producing an electronic control apparatus includes a printed circuit board with a first surface side and a second surface side and with at least one electronic component that is arranged on at least one of the surface sides of the printed circuit board, where at least one heat sink is arranged on the printed circuit board on the opposite surface side from the electronic component for the purpose of heat dissipation. The printed circuit board with the electronic component and the heat sink are surrounded by a casing made from a thermosetting plastic material such that at least one outer side of the heat sink remains free of thermosetting plastic material.

In some examples, the heat sink is fixed in a tool and for example pushed onto the printed circuit board by a closing force of the tool. By way of example, a casing made from thermosetting plastic material is applied to both sides of the printed circuit board with the electronic component and the heat sink by an injection process.

In some examples, the printed circuit board and the heat sink heat up and soften during the injection process. During the injection process the printed circuit board may be pushed against the heat sink fixed in a tool owing to a hydrostatic pressure of the liquid thermosetting plastic material.

For example, a softening of the printed circuit board and the heat sink partially immerses or presses at least the surface side of the printed circuit board, with or without connectors and/or components, that points in the direction of the heat sink into the thermoplastic material of the heat sink.

By way of example, this forms a material bond between the printed circuit board and the heat sink after the printed circuit board and the heat sink cool.

In some implementations, the heat sink and optionally a plastic connector are connected to one of the surface sides of the printed circuit board with a form fit, in materially bonded fashion or with a force fit in one process step by hot swaging, hot pressing, cold pressing or snap connection.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
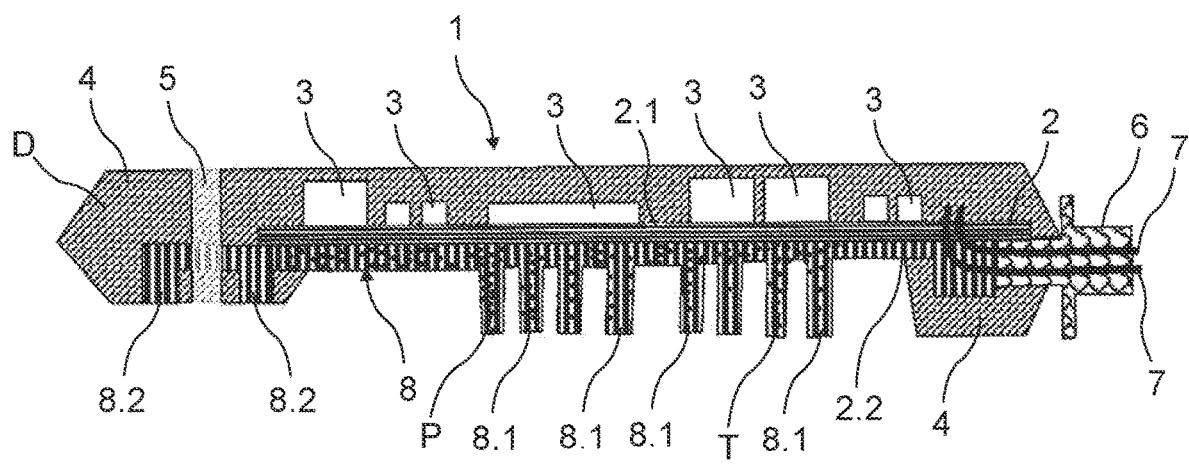
FIG. 1 shows a schematic depiction of an electronic control apparatus in a side view.

FIG. 1 shows an electronic control apparatus 1 having a printed circuit board 2 with a first surface side 2.1 and a second surface side 2.2 and with at least one electronic component 3, which is arranged on the surface side 2.1 of the printed circuit board 2. At least one heat sink 8 is arranged on the printed circuit board 2 on the opposite surface side 2.2 from the electronic component 3 for the purpose of heat dissipation. The printed circuit board 2 with the electronic component 3 and the heat sink 8 is surrounded on both sides by a casing 4 made from a thermosetting plastic material D such that at least one outer side of the heat sink 8 is free of thermosetting plastic material D.

Alternatively, the printed circuit board 2 with the electronic component 3 and the heat sink 8 can be surrounded by the casing 4 on one side (not depicted in more detail).

By way of example, the thermosetting plastic material D has material properties, for example a thermal expansion or a rigidity, such that there is no gap formation between the casing 4 and the heat sink 8.

Moreover, the electronic control apparatus 1 has a plastic connector 6 and a connector stamped grid 7.

The at least one electronic component 3, for example a resistor, a capacitor or an inductive component, is arranged on the surface side 2.1 of the printed circuit board 2.

The heat sink 8 is arranged on the printed circuit board 2 on the opposite surface side 2.2 from the electronic component 3 and thus dissipates the heat from the electronic components 3. The heat sink 8 is in planar and, for example, extensive or large-area form toward the surface side 2.2 of the printed circuit board 2 and towards the other opposite side, the heat sink 8 is provided with ribs 8.1, for example.

The heat sink 8 is formed from a thermally conductive thermoplastic material T and provided with thermally conductive particles P, for example filled with thermally conductive particles P. By way of example, the thermally conductive particles P provided are graphite particles and/or metal particles, for example, aluminum particles. By way of example, at least the metal particles have an electrical conductivity.

In some examples, the heat sink 8 is connected to the printed circuit board 2 with a form fit, in materially bonded fashion or with a force fit by means of hot swaging, press connections or snap connection, for example by pins.

In some examples, the heat sink 8 and the plastic connector 6 are arranged on the printed circuit board 2 in the same process step.

The heat sink 8 may be connected to the printed circuit board 2 at room temperature by pressing or snap fitting. If the heat sink 8 and the printed circuit board 2 are connected during the injection process for the thermosetting plastic material D, the printed circuit board 2 is pushed at least partially into the heat sink 8 made from the thermoplastic material T, so as to produce a material bond between the printed circuit board 2 and the heat sink 8.

The heat sink 8 may be made from a thermoplastic material T and is materially bonded to the printed circuit board 2 during the injection process, such as, the encasing process for the thermosetting plastic material D.

In some examples, the heat sink 8 has at least one contact point 8.2 that rests on a housing of a motor or of a hydraulic element, for example.

The casing 4 has at least one hole 5 and is formed from a thermosetting plastic material.

The plastic connector 6 is installed on the printed circuit board 2 and is used for making contact with for example a further electronic component, which is not shown. By way of example, the plastic connector 6 is hot swaged or pressed onto the printed circuit board 2. The plastic connector 6 projects from the casing 4 and is connected to the printed circuit board 2 and/or a further electronic component, which is not shown, by the connector stamped grid 7, for example.

Figure 2:
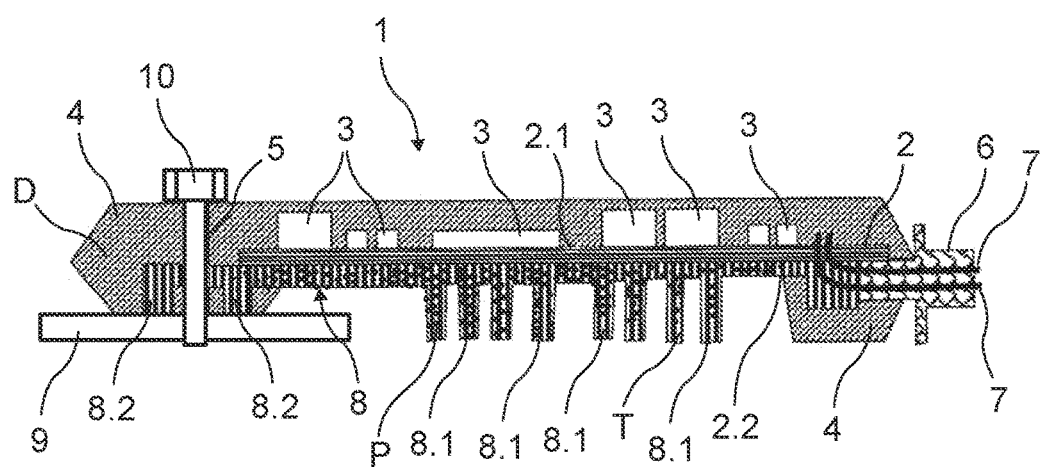
FIG. 2 shows a schematic depiction of an electronic control apparatus and a housing in a side view.

FIG. 2 shows a control apparatus 1 as shown in FIG. 1, where the control apparatus 1 is fixed for example to a mechanical interface 9, for example a housing of a motor or of a hydraulic unit.

In some examples, the at least one contact point 8.2 of the heat sink 8 rests on the mechanical interface 9.

The control apparatus 1 is fastened to the mechanical interface 9 for example by the hole 5 and a fastening means 10, for example a screw.

Alternatively, the electronic control apparatus 1 is fastened to the mechanical interface 9 by a clip, which is not shown in more detail.

A number of implementations have been described. Nevertheless, it will be understood that various modifications may be made without departing from the spirit and scope of the disclosure. Accordingly, other implementations are within the scope of the following claims.

LIST OF REFERENCE SIGNS

1 Control apparatus
2 Printed circuit board
2.1 Surface side
2.2 Surface side
3 Electronic component 4 Casing
5 Hole
6 Plastic connector
7 Connector stamped grid
8 Heat sink
8.1 Rib
8.2 Contact point
9 Mechanical interface
10 Fastening means
D Thermosetting plastic material
P Particles
T Thermoplastic material

What is claimed is:

1. An electronic control apparatus comprising:
    a printed circuit board with a first surface side and a second surface side and with at least one electronic component that is arranged on at least one of the first and second surface sides of the printed circuit board, and
    at least one heat sink is arranged on the printed circuit board on the opposite surface side from the electronic component for heat dissipation, wherein the printed circuit board with the electronic component and the heat sink is surrounded by a casing made from a thermosetting plastic material such that at least one outer side of the heat sink is free of thermosetting plastic material; and
    a ribbed profile being part of the at least one heat sink, the ribbed profile extending away from a first side of the at least one heat sink, and the printed circuit board in contact with a second side of the at least one heat sink.

2. The electronic control apparatus as claimed in claim 1, wherein the heat sink is formed from a thermoplastic material.

3. The electronic control apparatus as claimed in claim 2, wherein the thermoplastic material is provided with thermally conductive particles.

4. The electronic control apparatus as claimed in claim 3, wherein the thermally conductive particles provided in the thermoplastic material are graphite particles and/or metal particles.

5. The electronic control apparatus as claimed in claim 3, wherein the thermally conductive particles provided in the thermoplastic material are aluminum particles.

6. The electronic control apparatus as claimed in claim 1, wherein the heat sink is materially bonded to the surface side of the printed circuit board.

7. The electronic control apparatus as claimed in claim 1, wherein the heat sink rests on at least one mechanical interface to a device via contact points.

8. The electronic control apparatus as claimed in claim 1, wherein the casing has at least one hole.

9. A method for producing an electronic control apparatus, comprising a printed circuit board with a first surface side and a second surface side and with at least one electronic component that is arranged on at least one of the surface sides of the printed circuit board;
    wherein at least one heat sink is arranged on the printed circuit board on the opposite surface side from the electronic component for heat dissipation;
    wherein the printed circuit board with the electronic component and the heat sink is surrounded by a casing made from a thermosetting plastic material such that at least one outer side of the heat sink remains free of thermosetting plastic material; and
    wherein a ribbed profile is part of the at least one heat sink, the ribbed profile extending away from a first side of the at least one heat sink, and the printed circuit board in contact with a second side of the at least one heat sink.

10. The method as claimed in claim 9, wherein the heat sink and a plastic connector are connected to one of the surface sides of the printed circuit board with a form fit, in materially bonded fashion or with a force fit in one process step by hot swaging, pressing or snap fitting.

11. A method for producing an electronic control apparatus, the method comprising:
    arranging at least one electronic component on at least one surface side of a printed circuit board having a first surface and a second surface;
    arranging at least one heat sink on the printed circuit board on the opposite surface side from the electronic component for the purpose of heat dissipation, such that a ribbed profile being part of the at least one heat sink extends away from a first side of the at least one heat sink, and the printed circuit board is in contact with a second side of the at least one heat sink; and
    surrounding the printed circuit board with the electronic component and the heat sink by a casing made from a thermosetting plastic material such that at least one outer side of the heat sink remains free of thermosetting plastic material.

12. The method as claimed in claim 11, further comprising connecting the heat sink and a plastic connector to one of the surface sides of the printed circuit board with a form fit, in materially bonded fashion or with a force fit in one process step by hot swaging, pressing or snap fitting.

* * * * *